(12) United States Patent
Chow et al.

(10) Patent No.: US 8,232,658 B2
(45) Date of Patent: Jul. 31, 2012

(54) STACKABLE INTEGRATED CIRCUIT PACKAGE SYSTEM WITH MULTIPLE INTERCONNECT INTERFACE

(75) Inventors: Seng Guan Chow, Singapore (SG); Heap Hoe Kuan, Singapore (SG); Dioscoro A. Merilo, Singapore (SG); Antonio B. Dimaano, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 37 days.

(21) Appl. No.: 12/113,888

(22) Filed: May 1, 2008

(65) Prior Publication Data

US 2008/0203549 A1    Aug. 28, 2008

Related U.S. Application Data

(63) Continuation of application No. 11/307,862, filed on Feb. 25, 2006, now Pat. No. 7,385,299.

(51) Int. Cl.
*H01L 23/31* (2006.01)

(52) U.S. Cl. . 257/790; 257/686; 257/696; 257/E23.048; 257/E23.127; 257/E25.006; 438/112; 438/127

(58) Field of Classification Search ............ 257/696, 257/790, 787, 686
See application file for complete search history.

(56) References Cited

U.S. PATENT DOCUMENTS

| | | | |
|---|---|---|---|
| 4,764,804 A | 8/1988 | Sahara et al. | |
| 5,186,383 A | 2/1993 | Melton et al. | |
| 5,214,308 A | 5/1993 | Nishiguchi et al. | |
| 5,269,453 A | 12/1993 | Melton et al. | |
| 5,650,667 A | 7/1997 | Liou | |
| 5,734,199 A | 3/1998 | Kawakita et al. | |
| 5,760,478 A | 6/1998 | Bozso et al. | |
| 5,770,888 A * | 6/1998 | Song et al. | 257/696 |
| 5,811,351 A | 9/1998 | Kawakita et al. | |
| 5,824,569 A | 10/1998 | Brooks et al. | |
| 5,828,128 A | 10/1998 | Higashiguchi et al. | |
| 5,920,118 A * | 7/1999 | Kong | 257/684 |
| 5,977,640 A | 11/1999 | Bertin et al. | |
| 5,977,641 A | 11/1999 | Takahashi et al. | |
| 6,043,430 A * | 3/2000 | Chun | 174/530 |
| 6,083,811 A | 7/2000 | Riding et al. | |
| 6,107,164 A | 8/2000 | Ohuchi | |
| 6,118,174 A * | 9/2000 | Kim | 257/676 |
| 6,121,682 A | 9/2000 | Kim | |
| 6,204,562 B1 | 3/2001 | Ho et al. | |
| 6,225,699 B1 | 5/2001 | Ference et al. | |
| 6,294,406 B1 | 9/2001 | Bertin et al. | |
| 6,297,131 B1 | 10/2001 | Yamada et al. | |
| 6,297,560 B1 * | 10/2001 | Capote et al. | 257/778 |
| 6,316,735 B1 | 11/2001 | Higashiguchi | |
| 6,337,510 B1 * | 1/2002 | Chun-Jen et al. | 257/666 |
| 6,369,454 B1 | 4/2002 | Chung | |
| 6,410,861 B1 | 6/2002 | Huang et al. | |
| 6,420,244 B2 | 7/2002 | Lee | |

(Continued)

*Primary Examiner* — Nathan Ha
*Assistant Examiner* — Abul Kalam
(74) *Attorney, Agent, or Firm* — Ishimaru & Associates LLP; Mikio Ishimura; Stanley Chang

(57) ABSTRACT

A stackable integrated circuit package system includes: forming a first integrated circuit die having a small interconnect and a large interconnect provided thereon; forming an external interconnect, having an upper tip and a lower tip, from a lead frame; mounting the first integrated circuit die on the external interconnect with the small interconnect on the lower tip and below the upper tip; and encapsulating around the small interconnect and around the large interconnect with an exposed surface.

20 Claims, 13 Drawing Sheets

U.S. PATENT DOCUMENTS

| | | |
|---|---|---|
| 6,448,665 B1 * | 9/2002 | Nakazawa et al. ............ 257/789 |
| 6,455,353 B2 | 9/2002 | Lin |
| 6,534,419 B1 | 3/2003 | Ong |
| 6,541,857 B2 | 4/2003 | Caletka et al. |
| 6,580,169 B2 | 6/2003 | Sakuyama et al. |
| 6,627,979 B2 | 9/2003 | Park |
| 6,649,445 B1 | 11/2003 | Qi et al. |
| 6,707,140 B1 | 3/2004 | Nguyen |
| 6,713,366 B2 | 3/2004 | Mong et al. |
| 6,740,980 B2 | 5/2004 | Hirose |
| 6,791,036 B1 | 9/2004 | Chen et al. |
| 6,791,168 B1 | 9/2004 | Connell et al. |
| 6,828,665 B2 | 12/2004 | Pu et al. |
| 6,851,598 B2 | 2/2005 | Gebauer et al. |
| 6,852,570 B2 | 2/2005 | Hasegawa |
| 6,881,611 B1 | 4/2005 | Fukasawa et al. |
| 7,084,500 B2 | 8/2006 | Swnson et al. |
| 7,090,482 B2 | 8/2006 | Tsukahara et al. |
| 7,122,906 B2 | 10/2006 | Doan |
| 7,138,707 B1 * | 11/2006 | Lee et al. ...................... 257/684 |
| 7,218,005 B2 | 5/2007 | Tago |
| 7,221,059 B2 | 5/2007 | Farnworth et al. |
| 7,335,994 B2 | 2/2008 | Klein et al. |
| 2002/0024124 A1 | 2/2002 | Hashimoto |
| 2002/0100955 A1 | 8/2002 | Potter et al. |
| 2003/0008510 A1 | 1/2003 | Grigg et al. |
| 2003/0038347 A1 | 2/2003 | Chiu et al. |
| 2003/0122223 A1 * | 7/2003 | Nakamura ..................... 257/668 |
| 2004/0004294 A1 * | 1/2004 | Hall et al. ...................... 257/783 |
| 2004/0106229 A1 * | 6/2004 | Jiang et al. .................... 438/106 |
| 2004/0124540 A1 | 7/2004 | Chen et al. |
| 2005/0075053 A1 | 4/2005 | Jung |
| 2005/0224969 A1 * | 10/2005 | Wu ................................ 257/737 |
| 2007/0158809 A1 | 7/2007 | Chow et al. |

* cited by examiner

STACKABLE INTEGRATED CIRCUIT PACKAGE SYSTEM WITH MULTIPLE INTERCONNECT INTERFACE

CROSS-REFERENCE TO RELATED APPLICATION(S)

This is a Continuation of application Ser. No. 11/307,862 filed Feb. 25, 2006, now U.S. Pat. No. 7,385,299.

The present application contains subject matter related to U.S. patent application Ser. No. 11/326,211, now U.S. Pat. No. 7,768,125. The related application is assigned to STATS ChipPAC Ltd. and the subject matter thereof is incorporated herein by reference thereto.

TECHNICAL FIELD

The present invention relates generally to integrated circuit packages and more particularly to a stacked integrated circuit package system.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

In response to the demands for improved packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Numerous package approaches stack multiple integrated circuit dice or package in package (PIP) or a combination. Other approaches include package level stacking or package on package (POP). Both concepts include stacking of two or more packages. KGD and assembly process yields are not an issue since each package can be tested prior to assembly, allowing KGD to be used in assembling the stack. But stacking integrated devices, package-in-package, package-on-package, or combinations thereof have assembly process difficulties caused by leaded packages having limited input and output (I/O) which limits its role 3D packaging. Current leaded packages also do not provide the flexibility to support the various integration and stacking options described earlier with the higher I/O count support.

Thus, a need still remains for a stackable integrated circuit package system providing low cost manufacturing, improved yields, reduction of integrated circuit package dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable integrated circuit package system including forming a first integrated circuit die having an interconnect provided thereon, forming an external interconnect, having an upper tip and a lower tip, from a lead frame, mounting the first integrated circuit die on the external interconnect with the interconnect on the lower tip and below the upper tip, and encapsulating around the interconnect with a surface exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the figures. The same numbers are used in all the figures to relate to the same elements.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Figure 1:
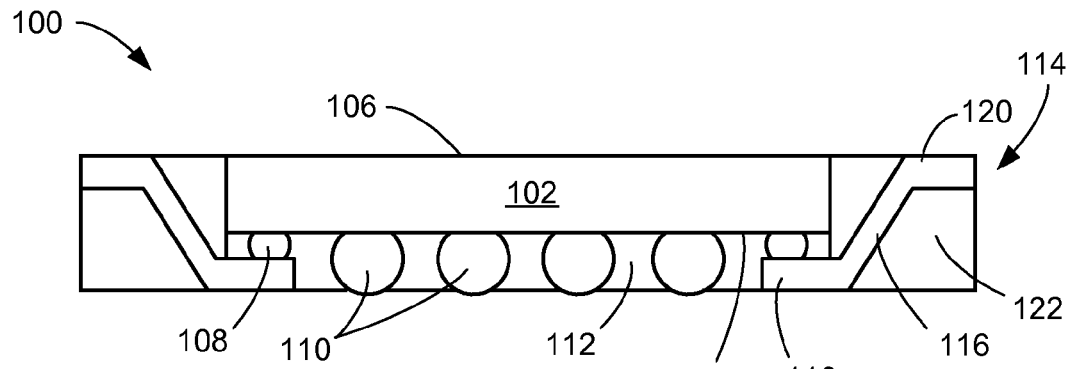
FIG. 1 is a cross-sectional view of a first stackable integrated circuit package system in an embodiment of the present invention.

Referring now to FIG. 1, therein is shown a cross-sectional view of a first stackable integrated circuit package system 100 in an embodiment of the present invention. An integrated circuit die 102 has an active side 104 and a non-active side 106. Small interconnects 108, such as solder balls, connect to the active side 104 at the boundary. Large interconnects 110, such as solder balls, connect to the active side 104 between the small interconnects 108. The "small" and "large" are a convenient designation since the sizes are in relation to each other where the small interconnects are smaller than the large interconnects and the large interconnects are larger than the small interconnects.

A mold compound 112 covers the active side 104. The mold compound 112 also surrounds the small interconnects 108 and the large interconnects 110 having exposed surfaces for external electrical connections. The mold compound 112 has a length and a width substantially the same as the integrated circuit die 102.

The integrated circuit die 102 attaches to a lead frame 114, such as a padless lead frame. The lead frame 114 has external interconnects 116, such as leads, which are bent forming die-attach lead tips 118 and non-die-attach lead tips 120. The die-attach lead tips 118 attach to the small interconnects 108. The non-die-attach lead tips 120 are bent to the substantially the same horizontal plane as the non-active side 106 of the integrated circuit die 102. It will be appreciated by those skilled in the art that if the lead frame 114 is manufactured by a bending process that the die-attach lead tips 118 and the non-die-attach lead tips 120 can be formed with a substantially similar thickness.

A package mold 122 encapsulates the integrated circuit die 102 and the external interconnects 116. The package mold 122 also exposes the non-active side 106, the large interconnects 110, the mold compound 112, the die-attach lead tips 118, and the non-die-attach lead tips 120. The large interconnects 110, the die-attach lead tips 118, and the non-die-attach lead tips 120 may connect to the next system level (not shown), such as a printed circuit board, or may be used in a stacked configuration with other devices (not shown).

Figure 2:
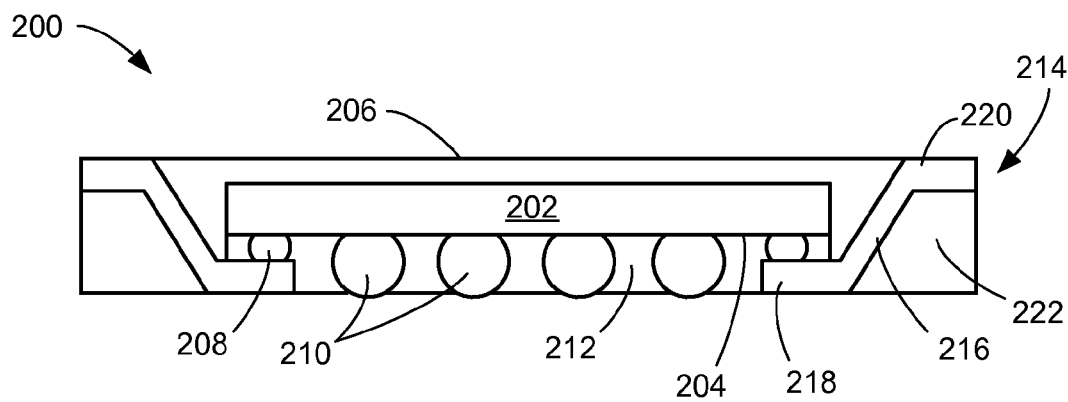
FIG. 2 is a cross-sectional view of a second stackable integrated circuit package system in an alternative embodiment of the present invention.

Referring now to FIG. 2, therein is shown a cross-sectional view of a second stackable integrated circuit package system 200 in an alternative embodiment of the present invention. Similarly, an integrated circuit die 202 has an active side 204 and a non-active side 206. Small interconnects 208, such as solder balls, connect to the active side 204 at the boundary. Large interconnects 210, such as solder balls, connect to the active side 204 between the small interconnects 208.

A mold compound 212 covers the active side 204. The mold compound 212 also surrounds the small interconnects 208 and the large interconnects 210 having exposed surfaces for external electrical connections. The mold compound 212 has a length and a width substantially the same as the integrated circuit die 202.

The integrated circuit die 202 attaches to a lead frame 214, such as a padless lead frame. The lead frame 214 has external interconnects 216, such as leads, which are bent forming die-attach lead tips 218 and non-die-attach lead tips 220. The die-attach lead tips 218 attach to the small interconnects 208. The non-die-attach lead tips 220 are bent above the horizontal plane of the non-active side 206.

A package mold 222 encapsulates the integrated circuit die 202 and the external interconnects 216. The package mold 222 also exposes the large interconnects 210, the mold compound 212, the die-attach lead tips 218, and the non-die-attach lead tips 220. The large interconnects 210, the die-attach lead tips 218, and the non-die-attach lead tips 220 may connect to the next system level (not shown), such as a printed circuit board, or may be used in a stacked configuration with other devices (not shown).

Figure 3:
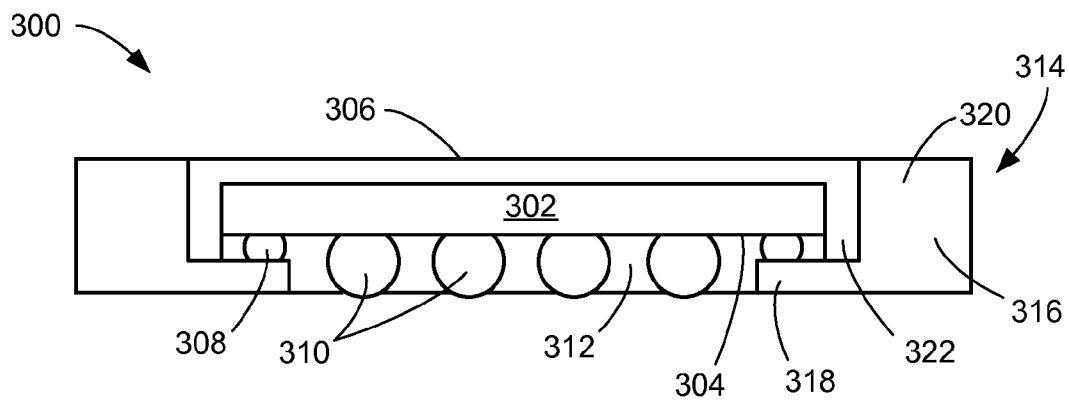
FIG. 3 is a cross-sectional view of a third stackable integrated circuit package system in another alternative embodiment of the present invention.

Referring now to FIG. 3, therein is shown a cross-sectional view of a third stackable integrated circuit package system 300 in another alternative embodiment of the present invention. Similarly, an integrated circuit die 302 has an active side 304 and a non-active side 306. Small interconnects 308, such as solder balls, connect to the active side 304 at the boundary. Large interconnects 310, such as solder balls, connect to the active side 304 between the small interconnects 308.

A mold compound 312 covers the active side 304. The mold compound 312 also surrounds the small interconnects 308 and the large interconnects 310 having exposed surfaces for external electrical connections. The mold compound 312 has a length and a width substantially the same as the integrated circuit die 302.

The integrated circuit die 302 attaches to a lead frame 314, such as a padless lead frame. The lead frame 314 has external interconnects 316, such as leads. Half etching the external interconnects 316 form die-attach lead tips 318. The non-etched portion of the external interconnects 316 are non-die-attach lead tips 320. The die-attach lead tips 318 attach to the small interconnects 308. The non-die-attach lead tips 320 are above the horizontal plane of the non-active side 306.

A package mold 322 encapsulates the integrated circuit die 302 and the external interconnects 316. The package mold 322 also exposes the large interconnects 310, the mold compound 312, the die-attach lead tips 318, and the non-die-attach lead tips 320. The large interconnects 310, the die-attach lead tips 318, and the non-die-attach lead tips 320 may connect to the next system level (not shown), such as a printed circuit board, or may be used in a stacked configuration with other devices (not shown).

Figure 4:
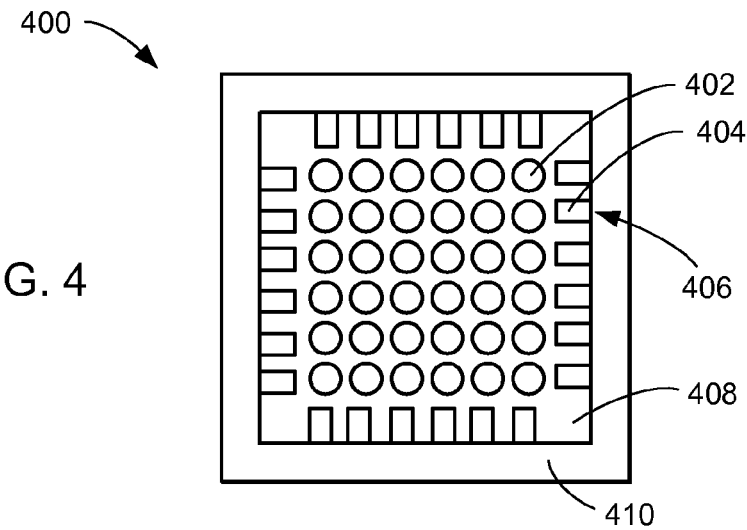
FIG. 4 is a bottom view of a stackable integrated circuit package system in an embodiment of the present invention.

Referring now to FIG. 4, therein is shown a bottom view of a stackable integrated circuit package system 400 in an embodiment of the present invention. The bottom view may also represents a bottom for other stackable integrated circuit package systems, such as the first stackable integrated circuit package system 100, the second stackable integrated circuit package system 200, or the third stackable integrated circuit package system 300.

The stackable integrated circuit package system 400 has an array distribution of large interconnects 402 between die-attach lead tips 404 of external interconnects 406. The array distribution has each of the large interconnects 402 equally spaced from on another. A mold compound 408 encapsulates the large interconnects 402 and the die-attach lead tips 404. The die-attach lead tips 404 serve as bonding pads for external connections. A package mold 410 surrounds the mold compound 408 and the external interconnects 406.

Figure 5:
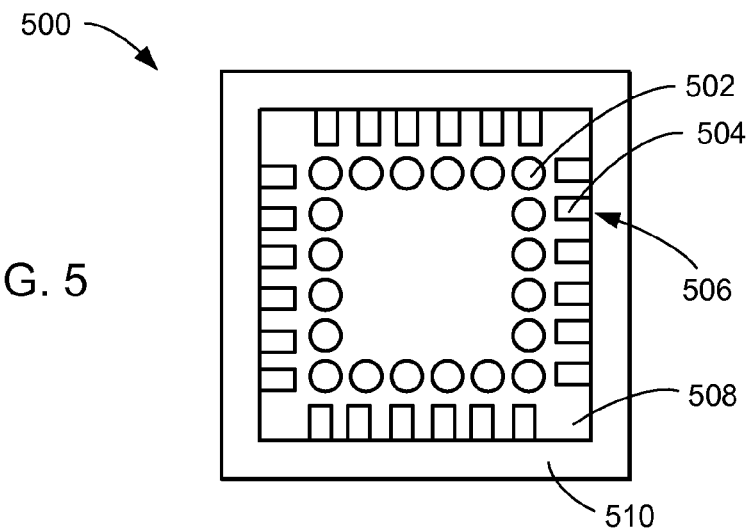
FIG. 5 is a bottom view of a stackable integrated circuit package system.

Referring now to FIG. 5, therein is shown a bottom view of a stackable integrated circuit package system 500 in an embodiment of the present invention. The bottom view may also represents a bottom for other stackable integrated circuit package systems, such as the first stackable integrated circuit package system 100, the second stackable integrated circuit package system 200, or the third stackable integrated circuit package system 300.

The stackable integrated circuit package system 500 has a peripheral distribution of large interconnects 502 between die-attach lead tips 504 of external interconnects 506. The peripheral distribution has each of the large interconnects 502 equally spaced from on another and next to the die-attach lead tips 504. A mold compound 508 encapsulates the large interconnects 502 and the die-attach lead tips 504. The die-attach lead tips 504 serve as bonding pads for external connections. A package mold 510 surrounds the mold compound 508 and the external interconnects 506.

Figure 6:
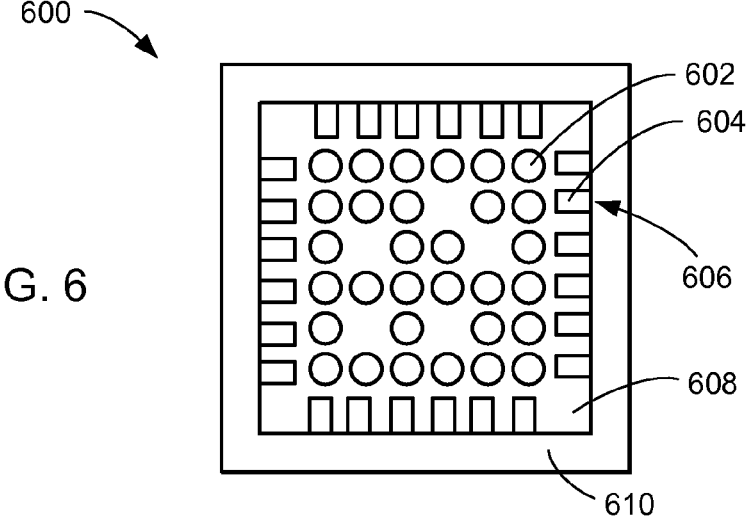
FIG. 6 is a bottom view of a stackable integrated circuit package system.

Referring now to FIG. 6, therein is shown a bottom view of a stackable integrated circuit package system 600 in an embodiment of the present invention. The bottom view may also represents a bottom for other stackable integrated circuit package systems, such as the first stackable integrated circuit package system 100, the second stackable integrated circuit package system 200, or the third stackable integrated circuit package system 300.

The stackable integrated circuit package system 600 has a partially depopulated distribution of large interconnects 602 between die-attach lead tips 604 of external interconnects 606. The partially depopulated distribution may have each of the large interconnects 602 differently or equally spaced from one another including locations of the large interconnects 602 that are depopulated. A mold compound 608 encapsulates the large interconnects 602 and the die-attach lead tips 604. The die-attach lead tips 604 serve as bonding pads for external connections. A package mold 610 surrounds the mold compound 608 and the external interconnects 606.

Figure 7:
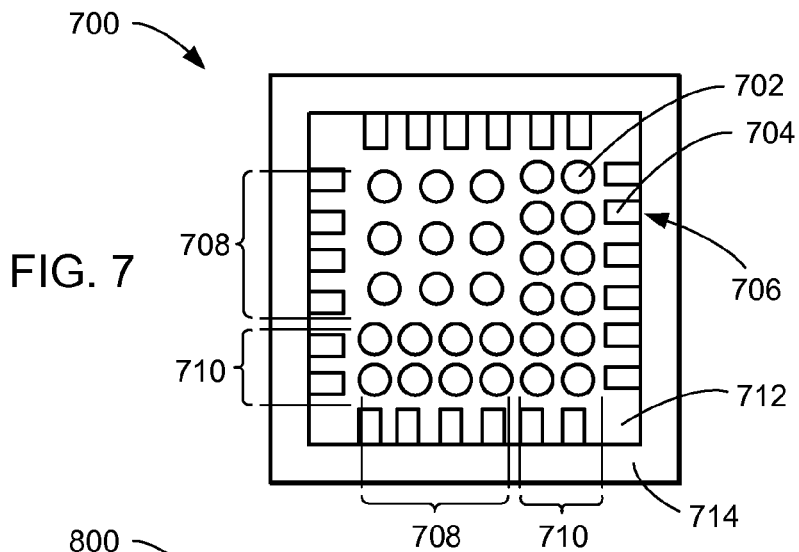
FIG. 7 is a bottom view of a stackable integrated circuit package system.

Referring now to FIG. 7, therein is shown a bottom view of a stackable integrated circuit package system 700 in an embodiment of the present invention. The bottom view may also represents a bottom for other stackable integrated circuit package systems, such as the first stackable integrated circuit package system 100, the second stackable integrated circuit package system 200, or the third stackable integrated circuit package system 300.

The stackable integrated circuit package system 700 has a multiple pitch distribution of large interconnects 702 with different pitches between die-attach lead tips 704 of external interconnects 706. The distribution has a first subset 708 of the large interconnects 702 at a first pitch and a second subset 710 of the large interconnects 702 at a second pitch with a value less than the first pitch. The first subset 708 is next to the external interconnects 706 at the upper left corner. The second subset 710 is next to the external interconnects 706 at the lower right corner and along the adjacent sides. A mold compound 712 encapsulates the large interconnects 702 and the die-attach lead tips 704. The die-attach lead tips 704 serve as bonding pads for external connections. A package mold 714 surrounds the mold compound 712 and the external interconnects 706. For illustrative purposes, the multiple pitch distribution is described as having the first subset 708 and the second subset 710, although it is understood that the different pitches between the large interconnects 702 may not be confined to any subset, number of subsets, or locations.

Figure 8:
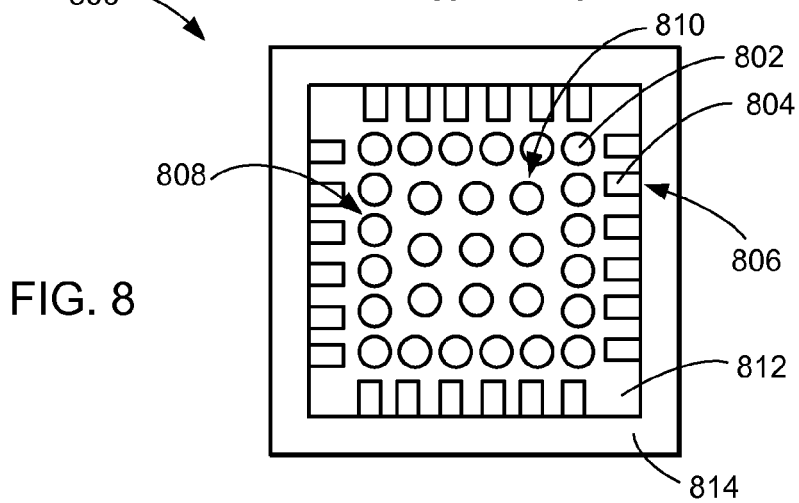
FIG. 8 is a bottom view of a stackable integrated circuit package system.

Referring now to FIG. 8, therein is shown a bottom view of a stackable integrated circuit package system 800 in an embodiment of the present invention. The bottom view may also represents a bottom for other stackable integrated circuit package systems, such as the first stackable integrated circuit package system 100, the second stackable integrated circuit package system 200, or the third stackable integrated circuit package system 300.

The stackable integrated circuit package system 800 has a mixed distribution of large interconnects 802 between die-attach lead tips 804 of external interconnects 806. The mixed distribution has a peripheral distribution 808 of the large interconnects 802 at a first pitch, similar to the peripheral distribution shown in FIG. 5, and an array distribution 810 between the peripheral distribution 808 of the large interconnects 802 at a second pitch. The peripheral distribution 808 has each of the large interconnects 802 equally spaced from on another and next to the die-attach lead tips 804. The array distribution 810 has each of the large interconnects 802 equally spaced from on another. A mold compound 812 encapsulates the large interconnects 802 and the die-attach lead tips 804. The die-attach lead tips 804 serve as bonding pads for external connections. A package mold 814 surrounds the mold compound 812 and the external interconnects 806.

Figure 9:
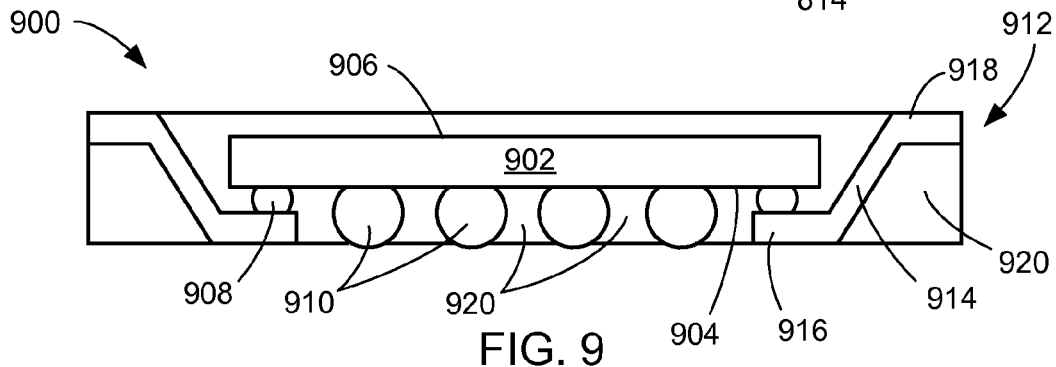
FIG. 9 is a cross-sectional view of a fourth stackable integrated circuit package system in yet another alternative embodiment of the present invention.

Referring now to FIG. 9, therein is shown a cross-sectional view of a fourth stackable integrated circuit package system 900 in yet another alternative embodiment of the present invention. An integrated circuit die 902 has an active side 904 and a non-active side 906. Small interconnects 908, such as solder balls, connect to the active side 904 at the boundary. Large interconnects 910, such as solder balls, connect to the active side 904 between the small interconnects 908.

The integrated circuit die 902 attaches to a lead frame 912, such as a padless lead frame. The lead frame 912 has external interconnects 914, such as leads, which are bent forming die-attach lead tips 916 and non-die-attach lead tips 918. The die-attach lead tips 916 attach to the small interconnects 908. The non-die-attach lead tips 918 are bent above the horizontal plane of the non-active side 906.

A package mold 920 encapsulates the integrated circuit die 902, the external interconnects 914, the small interconnects 908, and the large interconnects 910. The package mold 920 also exposes the large interconnects 910, the die-attach lead tips 916, and the non-die-attach lead tips 918. The large interconnects 910, the die-attach lead tips 916, and the non-die-attach lead tips 918 may connect to the next system level (not shown), such as a printed circuit board, or may be used in a stacked configuration with other devices (not shown).

Figure 10:
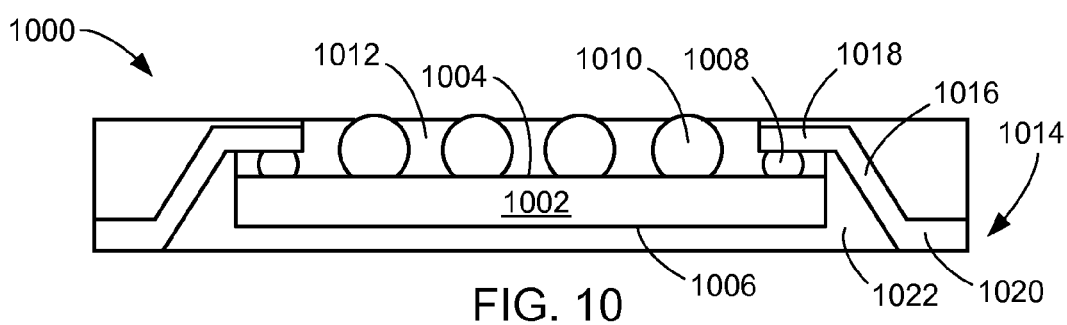
FIG. 10 is a cross-sectional view of a fifth stackable integrated circuit package system in yet another alternative embodiment of the present invention.

Referring now to FIG. 10, therein is shown a cross-sectional view of a fifth stackable integrated circuit package system 1000 in yet another alternative embodiment of the present invention. An integrated circuit die 1002 has an active side 1004 and a non-active side 1006. Small interconnects 1008, such as solder balls, connect to the active side 1004 at the boundary. Large interconnects 1010, such as solder balls, connect to the active side 1004 between the small interconnects 1008.

A mold compound 1012 covers the active side 1004. The mold compound 1012 also surrounds the small interconnects 1008 and the large interconnects 1010 having exposed surfaces for external electrical connections. The mold compound 1012 has a length and a width substantially the same as the integrated circuit die 1002.

The integrated circuit die 1002 attaches to a lead frame 1014, such as a padless lead frame. The lead frame 1014 has external interconnects 1016, such as leads, which are bent forming die-attach lead tips 1018 and non-die-attach lead tips 1020. The die-attach lead tips 1018 attach to the small interconnects 1008. The non-die-attach lead tips 1020 are bent below the horizontal plane of the non-active side 1006.

A package mold 1022 encapsulates the integrated circuit die 1002 and the external interconnects 1016. The package mold 1022 also exposes the large interconnects 1010, the mold compound 1012, and the non-die-attach lead tips 1020. The large interconnects 1010 and the non-die-attach lead tips 1020 may connect to the next system level (not shown), such as a printed circuit board, or may be used in a stacked configuration with other devices (not shown).

Figure 11:
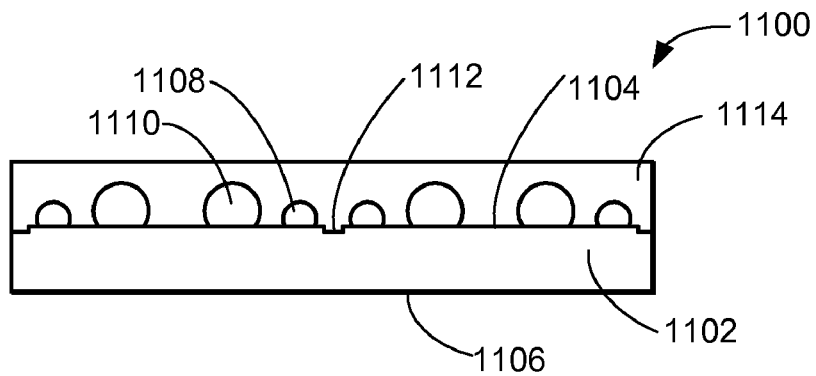
FIG. 11 is a cross-sectional view of a first wafer structure in an embodiment of the present invention.

Referring now to FIG. 11, therein is shown a cross-sectional view of a first wafer structure 1100 in an embodiment of the present invention. The first wafer structure 1100 includes a wafer 1102 with an active side 1104 and a non-active side 1106. Small interconnects 1108 and large interconnects 1110 are deposited on the wafer 1102.

Saw streets 1112 are formed in a top portion of the active side 1104 of the wafer 1102 and located between the small interconnects 1108. A mold compound 1114 is applied on the active side 1104 of the wafer 1102. The small interconnects 1108 and the large interconnects 1110 are embedded within the mold compound 1114.

Figure 12:
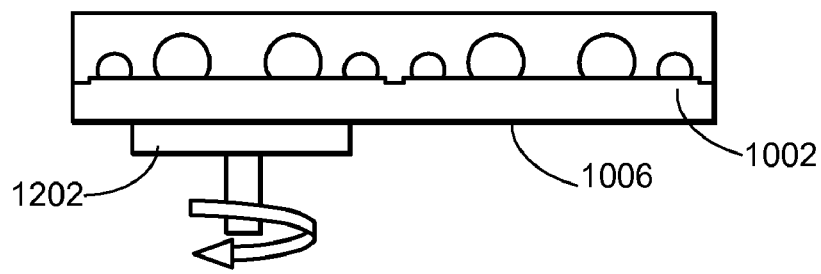
FIG. 12 is the structure of FIG. 11 in a bottom grinding phase.

Referring now to FIG. 12, therein is shown the structure of FIG. 11 in a bottom grinding phase. The non-active side 1106 of the wafer 1102 is planarized to a predetermined surface flatness and thickness. The non-active side 1106 may be planarized by grinding using a grinding wheel 1202.

Figure 13:
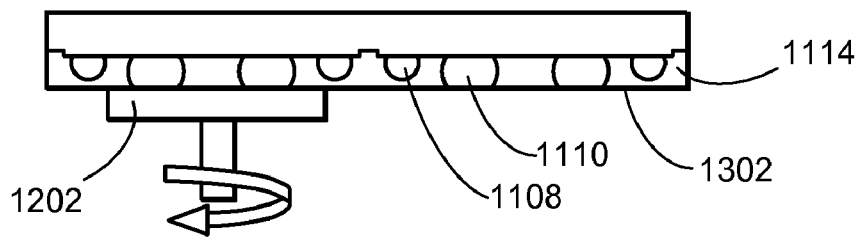
FIG. 13 is the structure of FIG. 12 in a top grinding phase.

Referring now to FIG. 13, therein is shown the structure of FIG. 12 in a top grinding phase. A portion of an exposed surface 1302 of the mold compound 1114 is planarized to a predetermined thickness such that it exposes a portion of the large interconnects 1110 while leaving the small interconnects 1108 unexposed. The portion of the exposed surface 1302 of the mold compound 1114 may be planarized by grinding, using the grinding wheel 1202.

Figure 14:
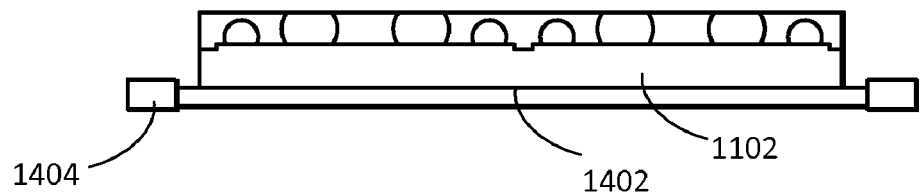
FIG. 14 is the structure of FIG. 13 in a dicing tape lamination phase.

Referring now to FIG. 14, therein is shown the structure of FIG. 13 in a dicing tape mount phase. The wafer 1102 is mounted on a dicing tape 1402 enclosed within a mounting frame 1404.

Figure 15:
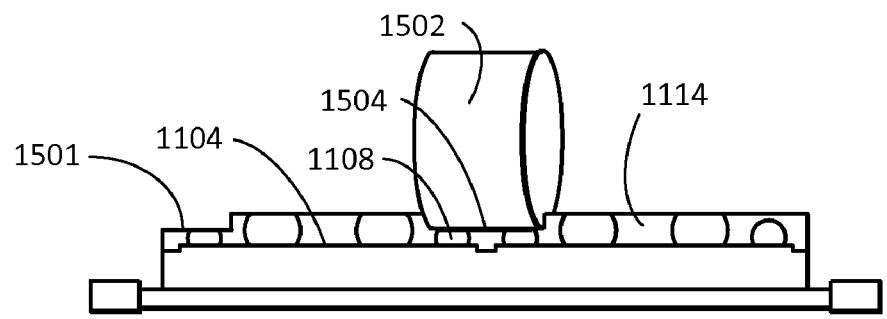
FIG. 15 is the structure of FIG. 14 in a notching phase.

Referring now to FIG. 15, therein is shown the structure of FIG. 14 in a notching phase. A portion of the mold compound 1114 and a portion of the small interconnects 1108 are cut. In at least one embodiment, the small interconnects 1108 can include a cut surface 1501. For example, a thick blade 1502 or selective etching may be used for creating notches 1504 on a portion of the active side 1104 of the mold compound 1114 such that it exposes a portion of the small interconnects 1108.

Figure 16:
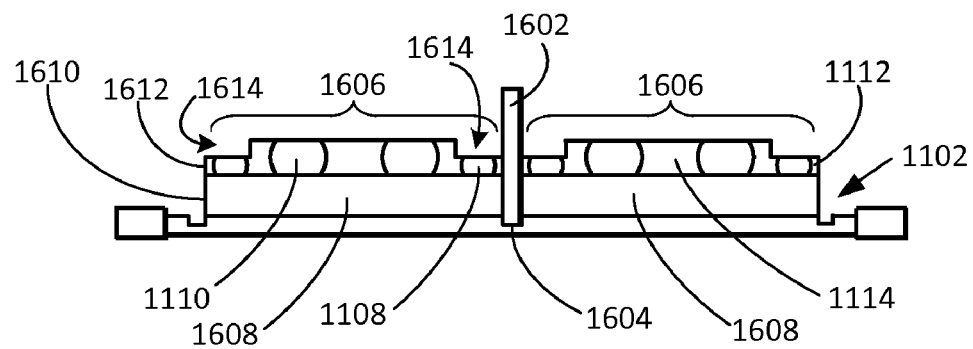
FIG. 16 is the structure of FIG. 15 in a singulation phase.

Referring now to FIG. 16, therein is shown the structure of FIG. 15 in a singulation phase. A dicing saw 1602 may be used for cutting the wafer 1102 and the mold compound 1114 to create a cut 1604 at the saw streets 1112 to provide a plurality of a molded die 1606 characterized as coming from the wafer 1102. In at least one embodiment, the dicing saw 1602 can cut through the mold compound 1114 and the wafer 1102 to form an integrated circuit die sidewall 1610 that is coplanar or substantially coplanar with a mold compound sidewall 1612. In some cases, the notches 1504, of FIG. 15, can form a step-shaped recess 1614 along or at an external edge or boundary of the mold compound 1114 with the step-shaped recess 1614 being formed adjacent and/or contiguous with the mold compound sidewall 1612. In a particular case, the step-shaped recess 1614 is only bounded by or defined by two exposed sides of the mold compound 1114 to form an open void space along the perimeter of the mold compound 1114 or the molded die 1606. The molded die 1606 includes an integrated circuit die 1608 having the small interconnects 1108 and the large interconnects 1110 attached thereon.

Figure 17:
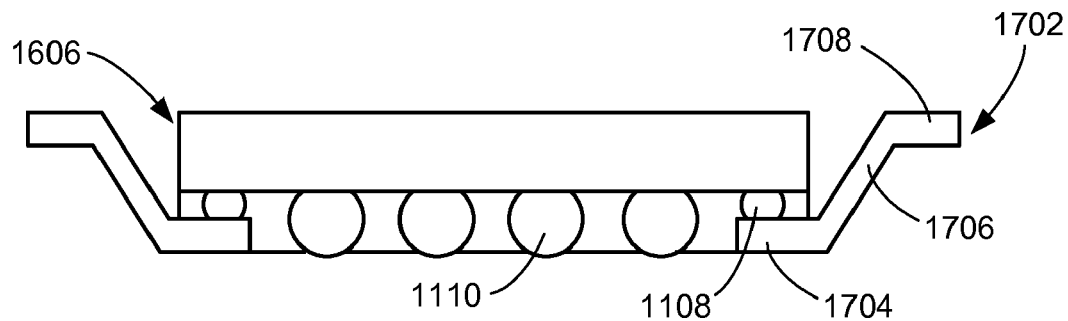
FIG. 17 is the structure of FIG. 16, singulated, in an electrical connection phase.

Referring now to FIG. 17, therein is shown the structure of FIG. 16, singulated, in an electrical connection phase. The molded die 1606, having the small interconnects 1108 and the large interconnects 1110 exposed, is attached on a lead frame 1702, such as a padless lead frame. The small interconnects 1108 are attached on die-attach lead tips 1704 of external interconnects 1706. The external interconnects 1706 also have non-die-attach lead tips 1708 at the other end.

Figure 18:
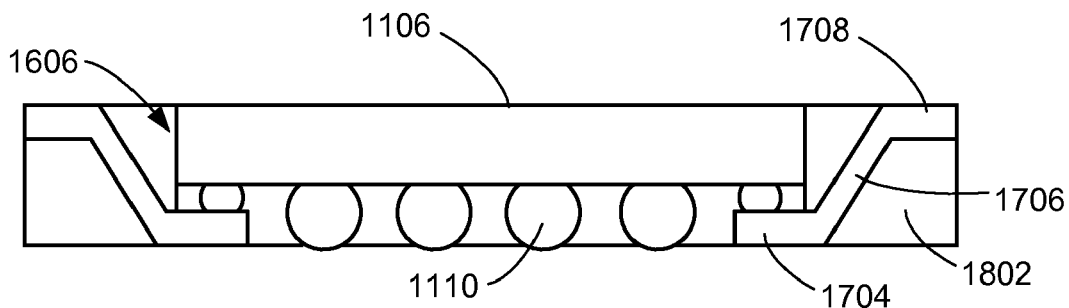
FIG. 18 is the structure of FIG. 17 in an encapsulation phase.

Referring now to FIG. 18, therein is shown the structure of FIG. 17 in an encapsulation phase. A package mold 1802 covers the molded die 1606 and the external interconnects 1706. The package mold 1802 also exposes the large interconnects 1110, the die-attach lead tips 1704, the non-active side 1106, and the non-die-attach lead tips 1708 forming a stackable integrated circuit package system similar to the structure of the first stackable integrated circuit package system 100 of FIG. 1.

Figure 19:
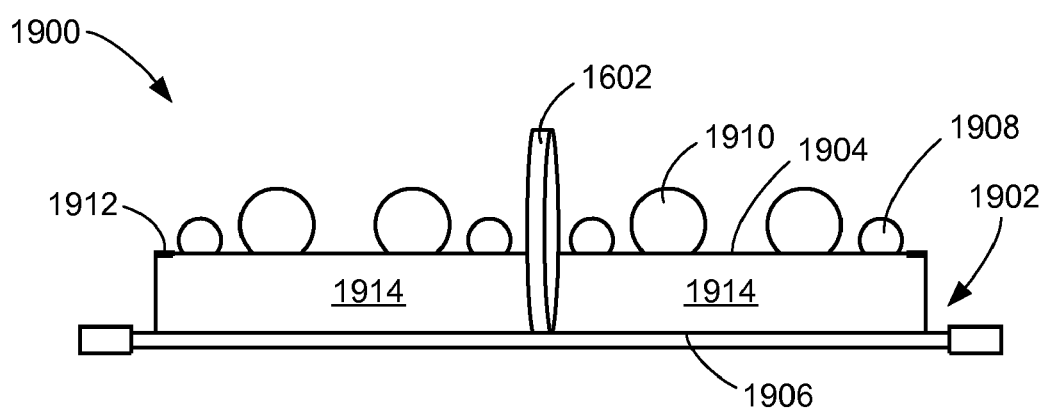
FIG. 19 is a cross-sectional view of a second wafer structure in a singulation phase in an alternative embodiment of the present invention.

Referring now to FIG. 19, therein is shown a cross-sectional view of a second wafer structure 1900 in a singulation phase in an alternative embodiment of the present invention. The second wafer structure 1900 includes a wafer 1902 with an active side 1904 and a non-active side 1906. Small interconnects 1908 and large interconnects 1910 are deposited on the active side 1904.

Saw streets 1912 are formed in a top portion of the active side 1904 of the wafer 1902 and located between the small interconnects 1908. The dicing saw 1602 may be used for cutting the wafer 1902 to provide a plurality of an integrated circuit die 1914, such as a flip chip, characterized as coming from the wafer 1902. The integrated circuit die 1914 includes the small interconnects 1908 and the large interconnects 1910 attached thereon.

Figure 20:
FIG. 20 is a cross-sectional view of a lead frame.

Referring now to FIG. 20, therein is shown a cross-sectional view of a lead frame 2000. The lead frame 2000, such as a padless lead frame, have external interconnects 2002. The external interconnects 2002 may be formed with a number of processes, such as bending, creating die-attach lead tips 2004 at lower portions of the external interconnects 2002 and non-die-attach lead tips 2006 at the upper portions of the external interconnects 2002. The lead frame 2000 is laminated with a mounting tape 2008, such as a high temperature tape.

Figure 21:
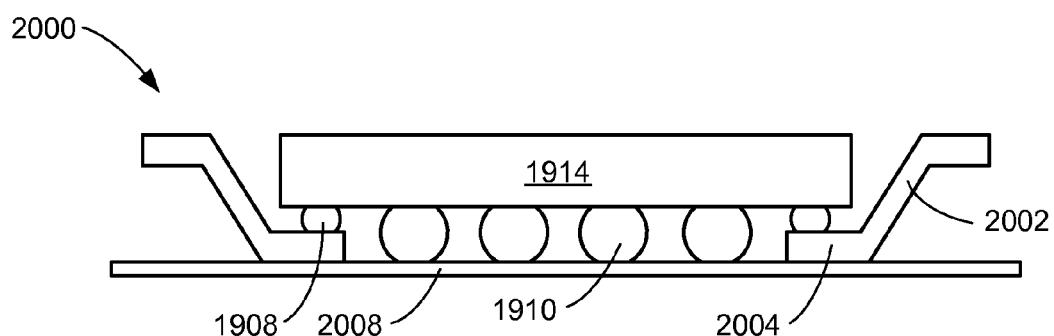
FIG. 21 is the structure of FIG. 19, singulated, in an electrical connection phase.

Referring now to FIG. 21, therein is shown the structure of FIG. 19, singulated, in an electrical connection phase. The integrated circuit die 1914 is mounted on the external interconnects 2002 of the lead frame 2000. The small interconnects 1908 are attached on the die-attach lead tips 2004 with a reflow process. The large interconnects 1910 are attached to the mounting tape 2008.

Figure 22:
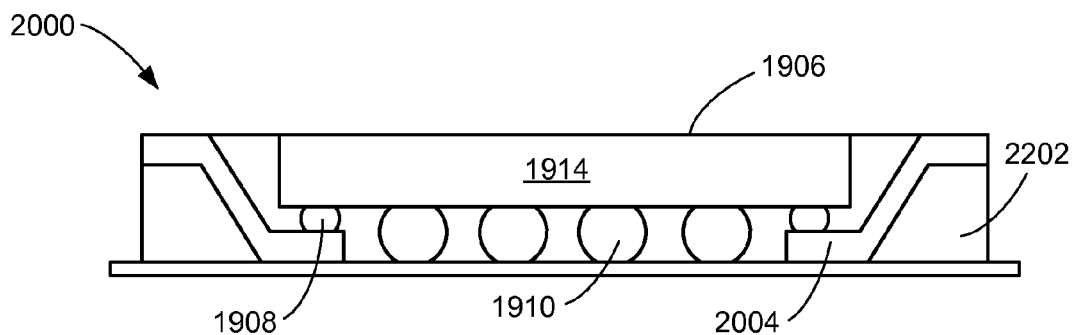
FIG. 22 is the structure of FIG. 21 in an encapsulation phase.

Referring now to FIG. 22, therein is shown the structure of FIG. 21 in an encapsulation phase. A package mold 2202 covers the integrated circuit die 1914 having the small interconnects 1908 and the large interconnects 1910, and the lead frame 2000. The non-active side 1906 is exposed and not covered by the package mold 2202. The mounting tape 2008 provides a boundary for the package mold 2202 leaving bottoms of the die-attach lead tips 2004 and the large interconnects 1910 not covered by the package mold 2202.

Figure 23:
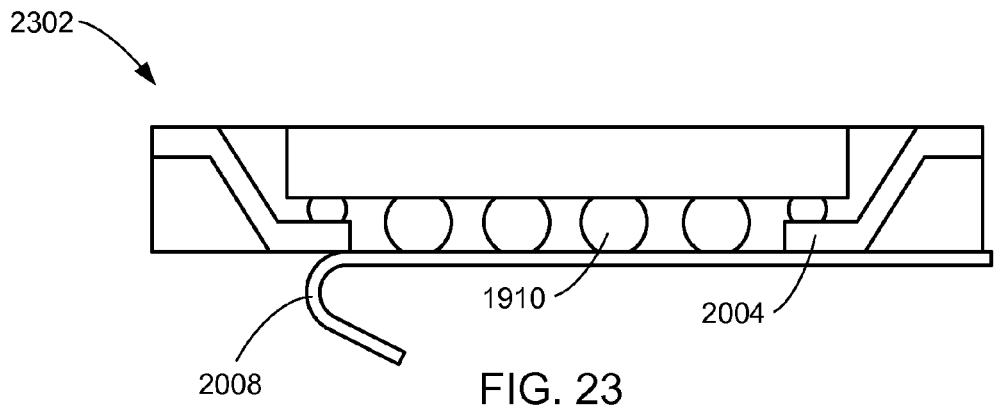
FIG. 23 is the structure of FIG. 22 in a singulation phase.

Referring now to FIG. 23, therein is shown the structure of FIG. 22 in a singulation phase. The mounting tape 2008 is removed from the structure of FIG. 22 exposing the die-attach lead tips 2004 and the large interconnects 1910. Singulation of the resultant structure forms a plurality of a stackable integrated circuit package system 2302, such as the fourth stackable integrated circuit package system 900. It is understood singulation may not be necessary and that the resultant structure may be the stackable integrated circuit package system.

Figure 24:
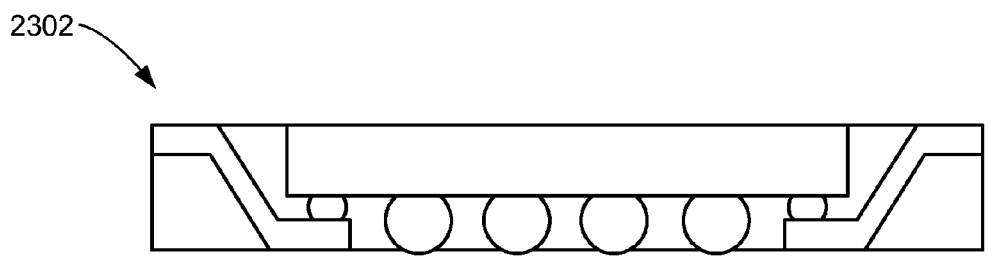
FIG. 24 is the structure of FIG. 23, singulated, in a cleaning phase.

Referring now to FIG. 24, therein is shown the structure of FIG. 23, singulated, in a cleaning phase. The stackable integrated circuit package system 2302 undergoes cleaning, such as plasma cleaning.

Figure 25:
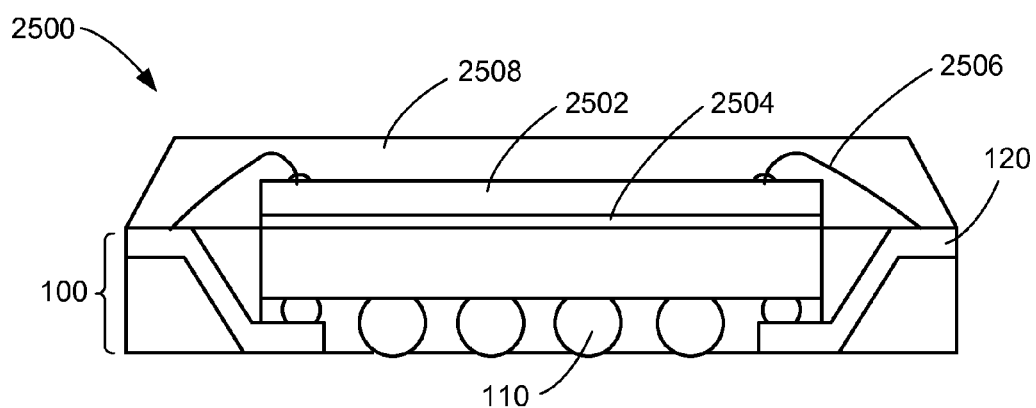
FIG. 25 is a cross-sectional view of a first stacked integrated circuit package system having the first stackable integrated circuit package system.

Referring now to FIG. 25, therein is shown a cross-sectional view of a first stacked integrated circuit package system 2500 having the first stackable integrated circuit package system 100. An upper integrated circuit die 2502 is attached on the first stackable integrated circuit package system 100 with an adhesive 2504. The upper integrated circuit die 2502 does not have a lead frame or substrate. Electrical interconnects 2506, such as bond wires, attach between the upper integrated circuit die 2502 and the non-die-attach lead tips 120. An encapsulation 2508, such as an epoxy mold compound, covers the upper integrated circuit die 2502 and the electrical interconnects 2506 on the first stackable integrated circuit package system 100. The large interconnects 110 allow more signal route for the upper integrated circuit die 2502.

Figure 26:
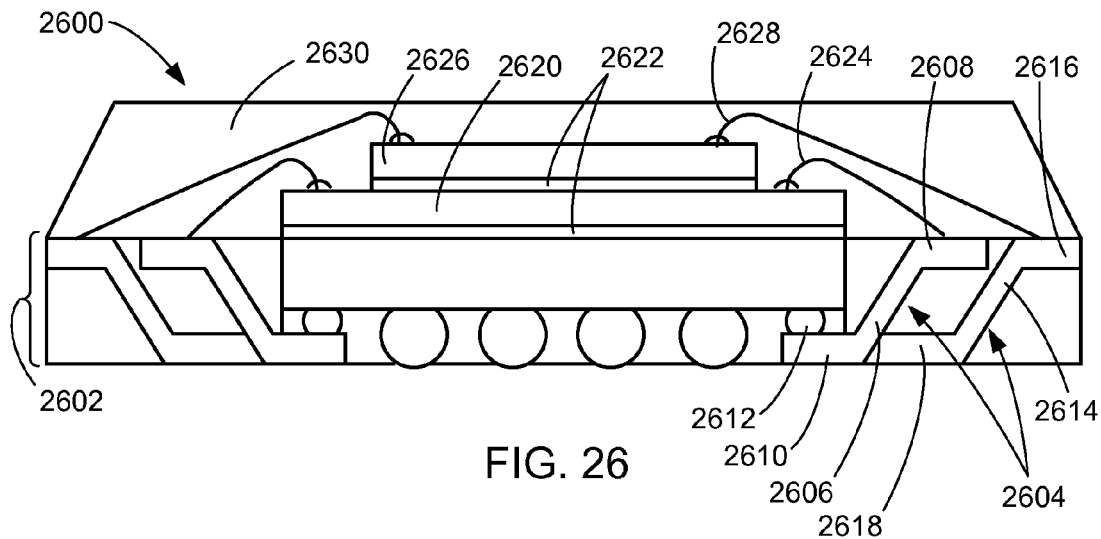
FIG. 26 is a cross-sectional view of a second stacked integrated circuit package system having a sixth stackable integrated circuit package system.

Referring now to FIG. 26, therein is shown a cross-sectional view of a second stacked integrated circuit package system 2600 having a sixth stackable integrated circuit package system 2602. The sixth stackable integrated circuit package system 2602 include a two rows of external interconnects 2604 and is similar in structure to the first stackable integrated circuit package system 100 of FIG. 1.

An inner row 2606 of the external interconnects 2604 include inner non-die-attach lead tips 2608 and inner die-attach lead-tips 2610 attached to small interconnects 2612. An outer row 2614 of the external interconnects 2604 include outer non-die-attach lead tips 2616 and outer die-attach lead-tips 2618 attached to the small interconnects 2612.

A first upper integrated circuit die 2620 is attached on the sixth stackable integrated circuit package system 2602 with an adhesive 2622. First electrical interconnects 2624, such as bond wires, attach between the first upper integrated circuit die 2620 and the inner non-die-attach lead tips 2608. A second upper integrated circuit die 2626 is stacked on the first upper integrated circuit die 2620 with the adhesive 2622. Second electrical interconnects 2628, such as bond wires, attach between the second upper integrated circuit die 2626 and the outer non-die-attach lead tips 2616. An encapsulation 2630, such as an epoxy mold compound, covers the first upper integrated circuit die 2620, the second upper integrated circuit die 2626, the first electrical interconnects 2624, and the second electrical interconnects 2628 on the sixth stackable integrated circuit package system 2602.

Figure 27:
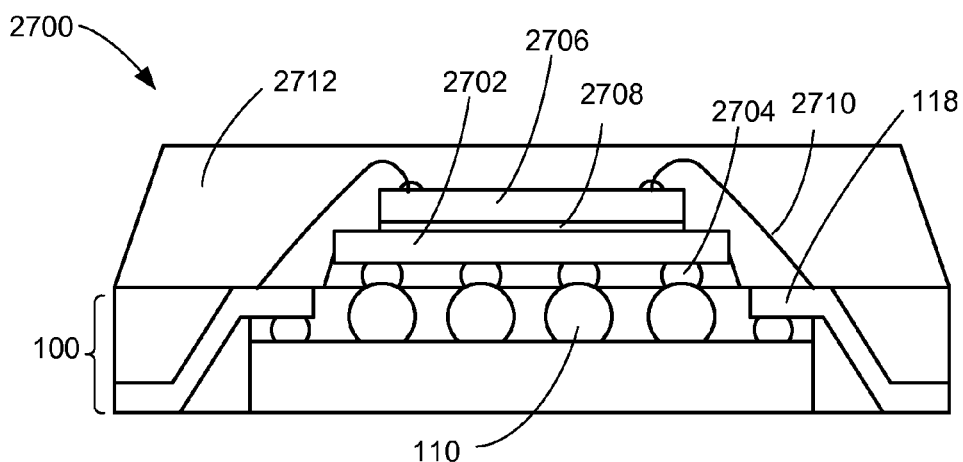
FIG. 27 is a cross-sectional view of a third stacked integrated circuit package system having the first stackable integrated circuit system, inverted.

Referring now to FIG. 27, therein is shown a cross-sectional view of a third stacked integrated circuit package system 2700 having the first stackable integrated circuit package system 100, inverted. A first upper integrated circuit die 2702, such as a flip chip, is mounted on the first stackable integrated circuit package system 100 with first electrical interconnects 2704, such as solder bumps, attached to the large interconnects 110. A second upper integrated circuit die 2706 is mounted on the first upper integrated circuit die 2702 with an adhesive 2708. Second electrical interconnects 2710, such as bond wires, attach between the second upper integrated circuit die 2706 and the die-attach lead tips 118. An encapsulation 2712, such as an epoxy mold compound, covers the first upper integrated circuit die 2702, the second upper integrated circuit die 2706, the first electrical interconnects 2704, and the second electrical interconnects 2710 on the first stackable integrated circuit package system 100.

Figure 28:
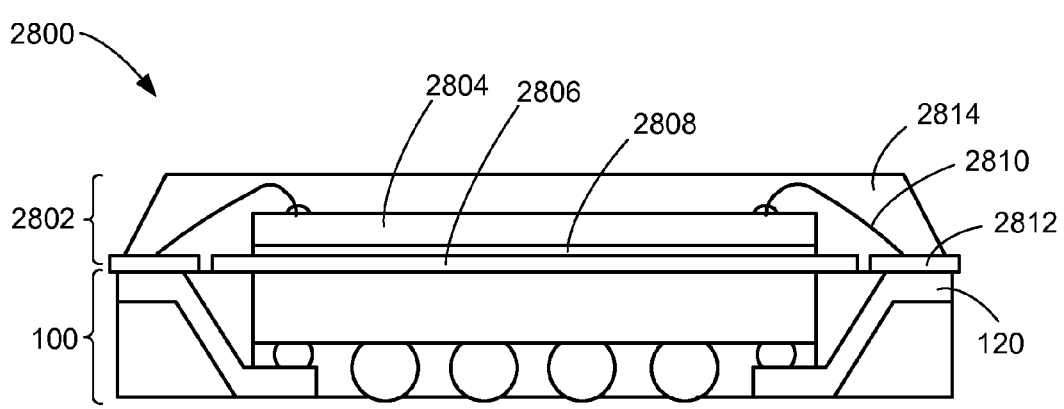
FIG. 28 is a cross-sectional view of a first integrated circuit package-on-package system having the first stackable integrated circuit package system.

Referring now to FIG. 28, therein is shown a cross-sectional view of a first integrated circuit package-on-package system 2800 having the first stackable integrated circuit package system 100. An upper device 2802, such as a leadless device, includes an upper integrated circuit die 2804 attached on a die paddle 2806 with an adhesive 2808. Electrical interconnects 2810, such as bond wires, attach between the upper integrated circuit die 2804 and external structures 2812 of the upper device 2802. An encapsulation 2814, such as an epoxy mold compound, covers the upper integrated circuit die 2804, the electrical interconnects 2810, the die paddle 2806, and the external structures 2812. The upper device 2802 is mounted on the first stackable integrated circuit package system 100 with the external structures 2812 connected to the non-die-attach lead tips 120.

Figure 29:
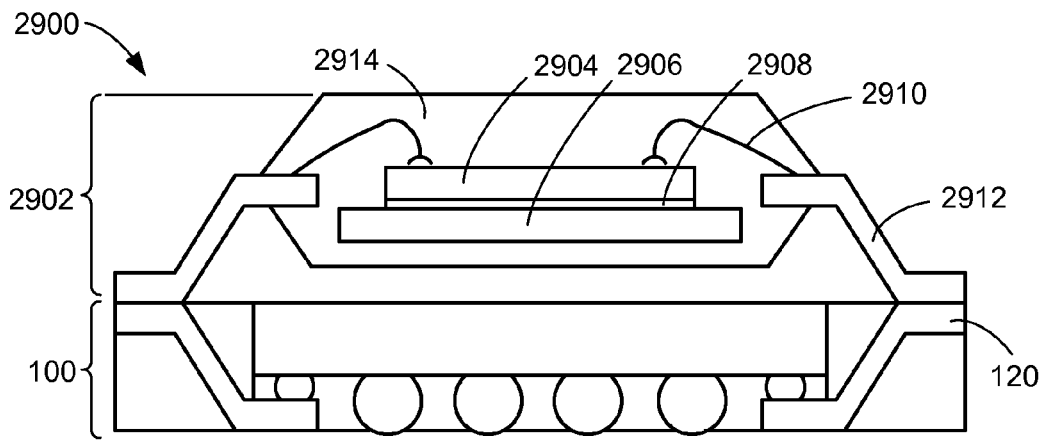
FIG. 29 is a cross-sectional view of a second integrated circuit package-on-package system having the first stackable integrated circuit package system.

Referring now to FIG. 29, therein is shown a cross-sectional view of a second integrated circuit package-on-package system 2900 having the first stackable integrated circuit package system 100. An upper device 2902, such as a leaded device, includes an upper integrated circuit die 2904 attached on a die paddle 2906 with an adhesive 2908. Electrical interconnects 2910, such as bond wires, attach between the upper integrated circuit die 2904 and external structures 2912 of the upper device 2902. An encapsulation 2914, such as an epoxy mold compound, covers the upper integrated circuit die 2904, the electrical interconnects 2910, the die paddle 2906, and the external structures 2912. The upper device 2902 is mounted on the first stackable integrated circuit package system 100 with the external structures 2912 connected to the non-die-attach lead tips 120.

Figure 30:
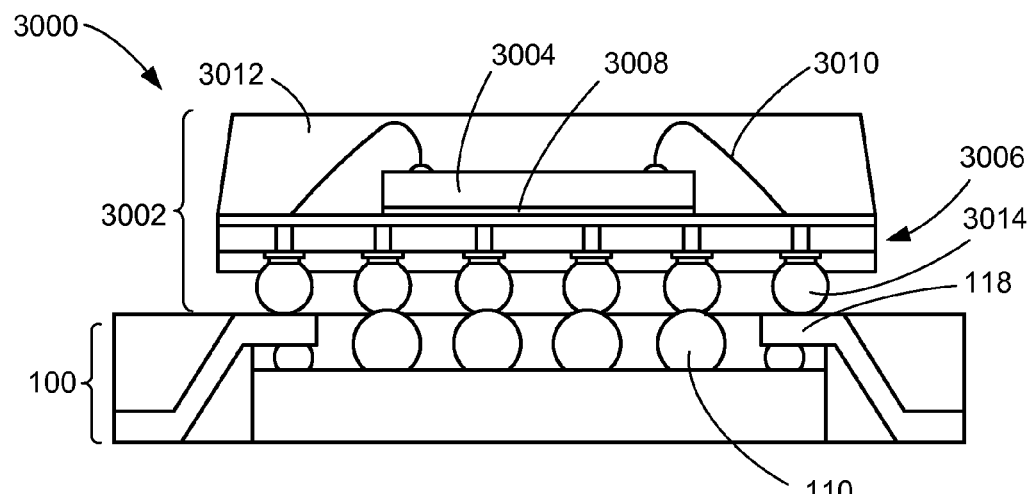
FIG. 30 is a cross-sectional view of a third integrated circuit package-on-package system having the first stackable integrated circuit package system, inverted.

Referring now to FIG. 30, therein is shown a cross-sectional view of a third integrated circuit package-on-package system 3000 having the first stackable integrated circuit package system 100, inverted. An upper device 3002, such as an array device, includes an upper integrated circuit die 3004 attached on a substrate 3006 with an adhesive 3008. Electrical interconnects 3010, such as bond wires, attach between the upper integrated circuit die 3004 and the substrate 3006. An encapsulation 3012, such as an epoxy mold compound, covers the upper integrated circuit die 3004, the electrical interconnects 3010, and the substrate 3006. External structures 3014, such as solder balls, are attached to the substrate 3006. The upper device 3002 is mounted on the first stackable integrated circuit package system 100 with the external structures 3014 attached to the large interconnects 110 and the die-attach lead tips 118.

Figure 31:
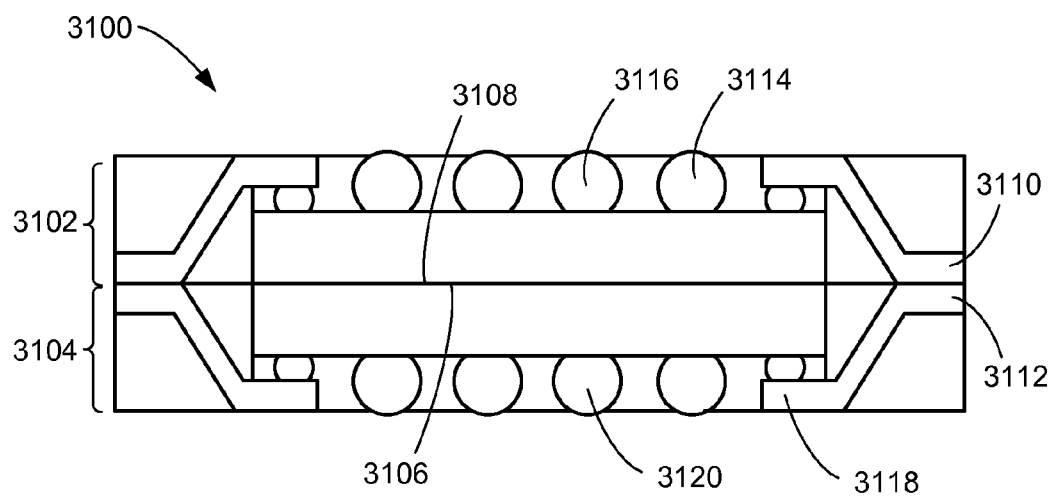
FIG. 31 is a cross-sectional view of a fourth integrated circuit package-on-package system having a top stackable integrated circuit package system on a bottom stackable integrated circuit package system.

Referring now to FIG. 31, therein is shown a cross-sectional view of a fourth integrated circuit package-on-package system 3100 having a top stackable integrated circuit package system 3102 on a bottom stackable integrated circuit package system 3104. The top stackable integrated circuit package system 3102 has a similar structure to the first stackable integrated circuit package system 100 of FIG. 1. Similarly, the bottom stackable integrated circuit package system 3104 has a similar structure to the first stackable integrated circuit package system 100. The top stackable integrated circuit package system 3102 may be another of the bottom stackable integrated circuit package system 3104 in an inverted orientation.

The top stackable integrated circuit package system 3102 is mounted on the bottom stackable integrated circuit package system 3104 with a top non-active side 3106 faces a bottom non-active side 3108. Top non-die-attach lead tips 3110 are attached to bottom non-die-attach lead tips 3112. Top die-attach lead tips 3114 and top large interconnects 3116 of the top stackable integrated circuit package system 3102 are exposed for further electrical connections. Bottom die-attach lead tips 3118 and bottom large interconnects 3120 of the bottom stackable integrated circuit package system 3104 are also exposed for further electrical connections.

Figure 32:
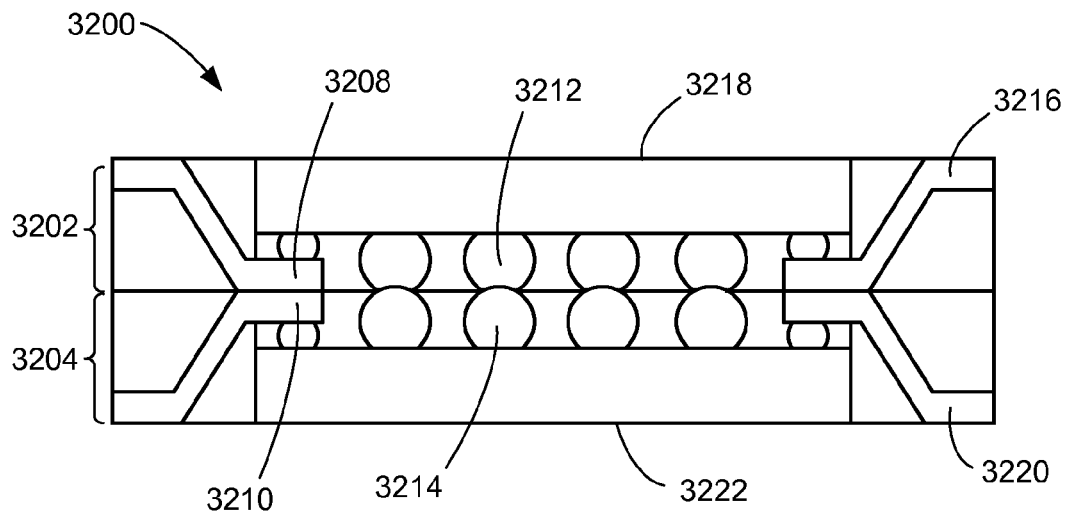
FIG. 32 is a cross-sectional view of a fifth integrated circuit package-on-package system having a top stackable integrated circuit package system on a bottom stackable integrated circuit package system.

Referring now to FIG. 32, therein is shown a cross-sectional view of a fifth integrated circuit package-on-package system 3200 having a top stackable integrated circuit package system 3202 on a bottom stackable integrated circuit package system 3204. The bottom stackable integrated circuit package system 3204 has a similar structure to the first stackable integrated circuit package system 100 of FIG. 1. Similarly, the top stackable integrated circuit package system 3202 has a similar structure to the first stackable integrated circuit package system 100. The top stackable integrated circuit package system 3202 may be another of the bottom stackable integrated circuit package system 3204 in an inverted orientation.

The top stackable integrated circuit package system 3202 is mounted on the bottom stackable integrated circuit package system 3204 with a top die-attach lead tips 3208 attached to bottom die-attach lead tips 3210 and top large interconnects 3212 attached to bottom large interconnects 3214. Top non-die-attach lead tips 3216 and top non-active side 3218 of the top stackable integrated circuit package system 3202 are exposed for further electrical connections. Bottom non-die-attach lead tips 3220 and bottom non-active side 3222 of the bottom stackable integrated circuit package system 3204 are also exposed for further electrical connections.

Figure 33:
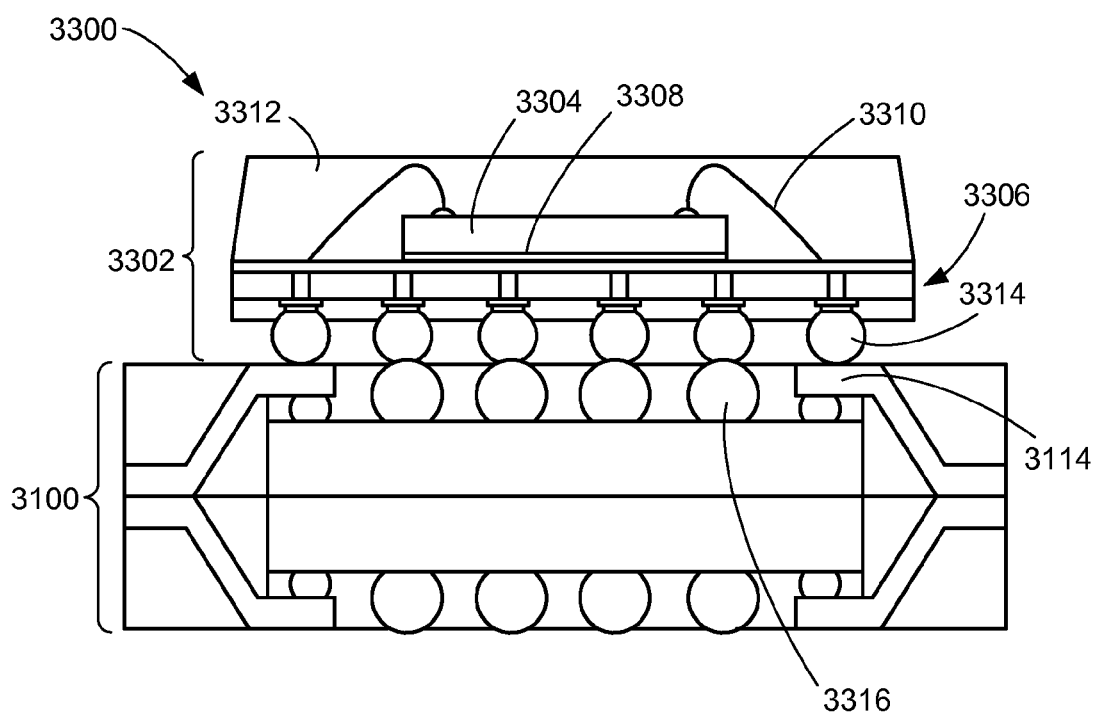
FIG. 33 is a cross-sectional view of a sixth integrated circuit package-on-package system having the fourth integrated circuit package-on-package system.

Referring now to FIG. 33, therein is shown a cross-sectional view of a sixth integrated circuit package-on-package system 3300 having the fourth integrated circuit package-on-package system 3100. An upper device 3302, such as an array device, includes an upper integrated circuit die 3304 attached on a substrate 3306 with an adhesive 3308. Electrical interconnects 3310, such as bond wires, attach between the upper integrated circuit die 3304 and the substrate 3306. An encapsulation 3312, such as an epoxy mold compound, covers the upper integrated circuit die 3304, the electrical interconnects 3310, and the substrate 3306. External structures 3314, such as solder balls, are attached to the substrate 3306. The upper device 3302 is mounted on the fourth integrated circuit package-on-package system 3100 with the external structures 3314 attached to the top large interconnects 3116 and the top die-attach lead tips 3114.

Figure 34:
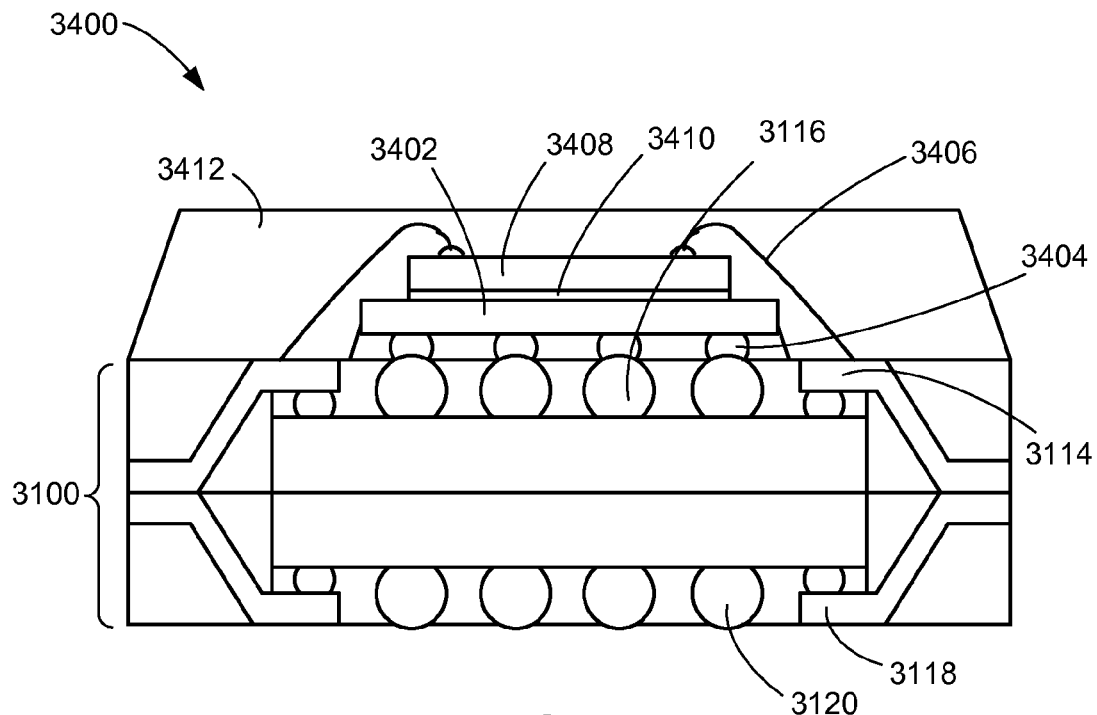
FIG. 34 is a cross-sectional view of a seventh integrated circuit package-on-package system having the fourth integrated circuit package-on-package system.

Referring now to FIG. 34, therein is shown a cross-sectional view of a seventh integrated circuit package-on-package system 3400 having the fourth integrated circuit package-on-package system 3100. A first upper integrated circuit die 3402, such as a flip chip, is mounted on the fourth integrated circuit package-on-package system 3100 with first electrical interconnects 3404, such as solder bumps, attached to the top large interconnects 3116. A second upper integrated circuit die 3408 is mounted on the first upper integrated circuit die 3402 with an adhesive 3410. Second electrical interconnects 3406, such as bond wires, attach between the second upper integrated circuit die 3408 and the top die-attach lead tips 3114.

An encapsulation 3412, such as an epoxy mold compound, covers the first upper integrated circuit die 3402, the second upper integrated circuit die 3408, the first electrical interconnects 3404, and the second electrical interconnects 3406 on the fourth integrated circuit package-on-package system 3100. The bottom die-attach lead tips 3118 and the bottom large interconnects 3120 are exposed for further electrical connections.

Figure 35:
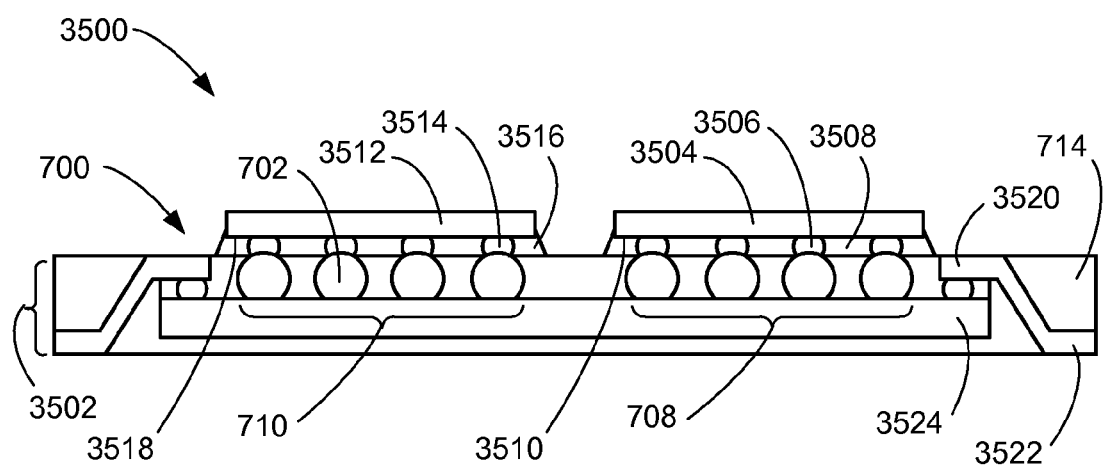
FIG. 35 is a cross-sectional view of an eighth integrated circuit package-on-package system.

Referring now to FIG. 35, therein is shown a cross-sectional view of an eighth integrated circuit package-on-package system 3500. The cross-sectional view depicts a stackable integrated circuit package system 3502 having the bottom view of the stackable integrated circuit package system 700 of FIG. 7. The large interconnects 702 have the first subset 708 with a first pitch and the second subset 710 with a second pitch, less than the first pitch.

A first upper integrated circuit die 3504, such as a flip chip, is mounted on the large interconnects 702 having the first pitch. First electrical interconnects 3506, such as solder bumps, of the first upper integrated circuit die 3504 have substantially the same pitch as the first pitch. A first encapsulant 3508 covers and protects a first active side 3510 of the first upper integrated circuit die 3504 and the first electrical interconnects 3506.

A second upper integrated circuit die 3512, such as a flip chip, is mounted on the large interconnects 702 having the second pitch. Second electrical interconnects 3514, such as solder bumps, of the second upper integrated circuit die 3512 have substantially the same pitch as the second pitch. A second encapsulant 3516 covers and protects a second active side 3518 of the second upper integrated circuit die 3512 and the second electrical interconnects 3514. For illustrative purpose, the large interconnects 702 are shown as having a configuration with the first subset 708 and the second subset 710, although it is understood the large interconnects 702 may have a different configuration, such as the array distribution, peripheral distribution, the partially depopulated distribution, the multiple pitch distribution, or the mixed distribution.

Die-attach lead tips 3520 and non-die-attach lead tips 3522 are exposed for further electrical connections. The package mold 714 covers an integrated circuit die 3524 of the stackable integrated circuit package system 3502.

Figure 36:
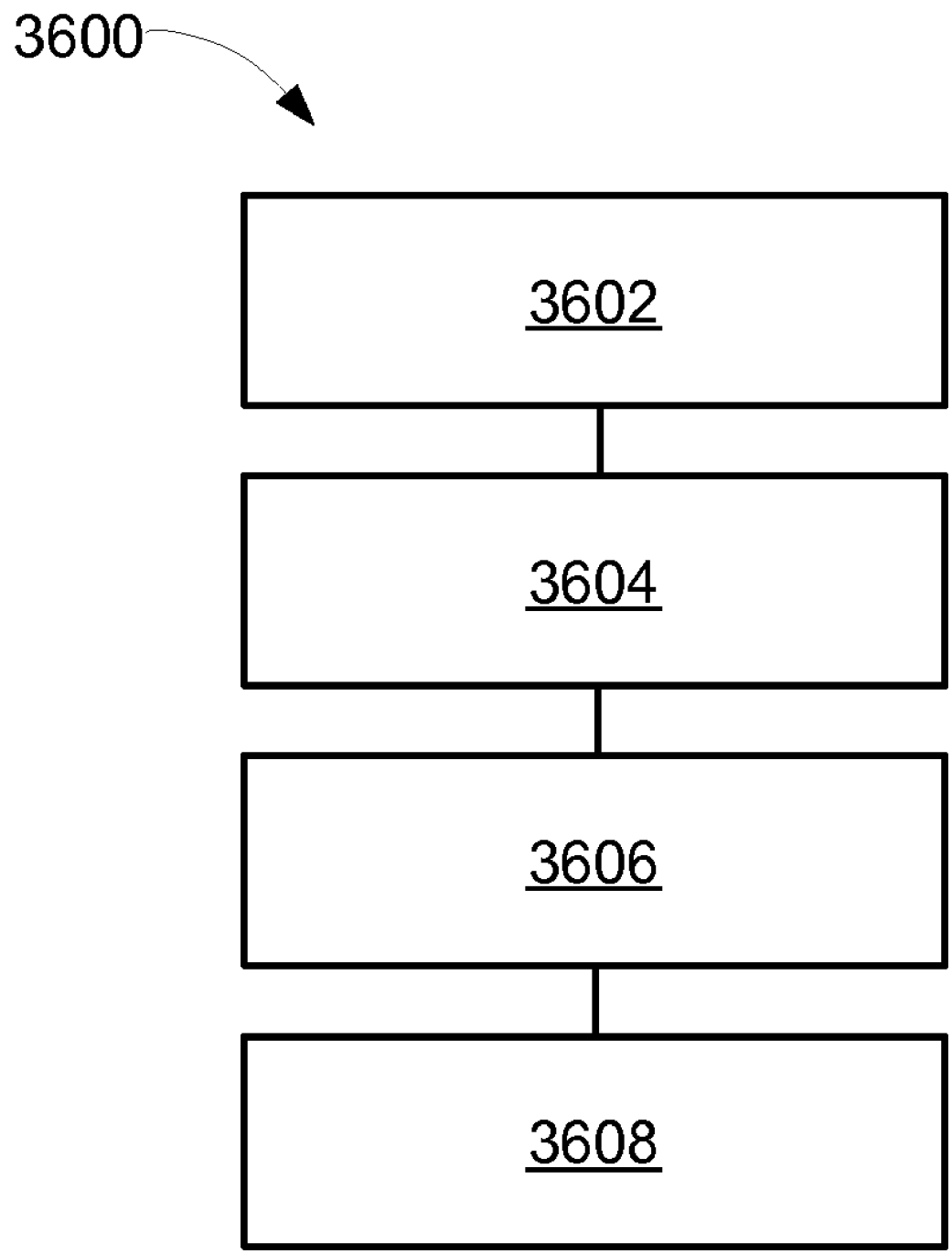
FIG. 36 is a flow chart of a stackable integrated circuit package system for manufacture of the stackable integrated circuit package system in an embodiment of the present invention.

Referring now to FIG. 36, therein is shown a flow chart of a stackable integrated circuit package system 3600 for manufacture of the stackable integrated circuit package system 100 in an embodiment of the present invention. The system 3600 includes forming a first integrated circuit die having an interconnect provided thereon in a block 3602; forming an external interconnect, having an upper tip and a lower tip, from a lead frame in a block 3604; mounting the first integrated circuit die on the external interconnect with the interconnect on the lower tip and below the upper tip in a block 3606; and encapsulating around the interconnect with a surface exposed in a block 3608.

It has been discovered that the present invention thus has numerous aspects.

It has been discovered that the stackable integrated circuit package system provides low cost and flexible manufacturing for increasing integrated circuit content in a minimum space. The use of existing equipments for manufacturing the stackable integrated circuit package offers a low cost manufacturing. The external connectivity option provides various integration and stacking options with known good die (KGD) increasing the overall manufacturing yield to decrease the overall manufacturing cost.

An aspect is that the present invention integrates the bumped devices into the leaded packages, allowing it to perform similar to a ball grid array (BGA) package while not increasing the overall package size.

Another aspect of the present invention is that the bumped integrated circuit die in the stackable integrated circuit package has direct signal to the printed circuit board (PCB) or to another external electrical connection, such as a device stacked on the bumped integrated circuit die, using flex-on-cap (FOC) technology. The bumped integrated circuit die also provides signal routing from a top device stacked on the stackable integrated circuit package to the PCB (daisy chain) using redistribution layer (RDL) technology serving as a dummy substrate/interposer. The bumped integrated circuit die further provides signal routing from the top device stacked on the stackable integrated circuit package, via bumped integrated circuit die circuitry, to the PCB using RDL technology.

Yet another aspect of the present invention is that the flexibility of integration and stacking options. The stackable integrated circuit package may for numerous stacked integrated circuit package with KGD in the form of bare dies or packaged devices. Also, the stackable integrated circuit package may form numerous package-on-package solutions with KGD in the form of bare dies or packaged devices. Further, the stackable integrated circuit package may form numerous package-in-package solutions with KGD in the form of bare dies or packaged devices. Yet further, the stackable integrated circuit package may form package solutions with a combination of the above mentioned package types, again with all KGD.

Yet another important aspect of the present invention is that it valuably supports and services the historical trend of reducing costs and increasing performance. These and other valuable aspects of the present invention consequently further the state of the technology to at least the next level.

Thus, it has been discovered that the stackable integrated circuit package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacture of a stackable integrated circuit package system comprising:
   forming a first integrated circuit die having a small interconnect and a large interconnect provided thereon;
   forming an external interconnect, having an upper tip and a lower tip each of substantially similar thickness and both including an exposed surface, from a lead frame;
   mounting the first integrated circuit die on the external interconnect with the small interconnect on the lower tip and below the upper tip;
   encapsulating with a first mold compound around the small interconnect and around the large interconnect with an exposed surface; and
   processing the first mold compound and the first integrated circuit die to include a first mold compound sidewall coplanar with a first integrated circuit die sidewall; and
   forming a step-shaped recess along a boundary of the first mold compound adjacent the first mold compound sidewall.

2. The method as claimed in claim 1 further comprising:
   encapsulating the integrated circuit die and the external interconnect in a second mold compound.

3. The method as claimed in claim 1 further comprising:
   encapsulating the integrated circuit die and the external interconnect in a second mold compound with both the upper tip and the lower tip including an exposed surface.

4. The method as claimed in claim 1 further comprising:
providing an additional integrated circuit die or integrated circuit package connected to the external interconnect, the large interconnect, the first integrated circuit die, or a combination thereof.

5. The method as claimed in claim 1 wherein forming the first integrated circuit die includes forming large interconnects with a distribution in a configuration of an array distribution, a peripheral distribution, a partially depopulated distribution, a multiple pitch distribution, or a combination thereof.

6. A method of manufacture of a stackable integrated circuit package system comprising:
forming a first integrated circuit die having a small interconnect and a large interconnect provided thereon;
forming a lead, having an upper tip and a lower tip each of substantially similar thickness and both including an exposed surface, from a padless lead frame;
mounting the first integrated circuit die on the lead with the small interconnect on the lower tip and below the upper tip; and
encapsulating with a first mold compound around the small interconnect and the large interconnect with an exposed surface; and
processing the first mold compound and the first integrated circuit die to include a first mold compound sidewall coplanar with a first integrated circuit die sidewall; and
forming a step-shaped recess along a boundary of the first mold compound adjacent the first mold compound sidewall.

7. The method as claimed in claim 6 further comprising:
encapsulating the integrated circuit die and the lead in a further encapsulant; and
exposing a non-active side of the integrated circuit die.

8. The method as claimed in claim 6 further comprising:
attaching a second integrated circuit die to the stackable integrated circuit package system; and
encapsulating the second integrated circuit die.

9. The method as claimed in claim 6 further comprising:
attaching a first integrated circuit package to the stackable integrated circuit package system.

10. The method as claimed in claim 6 further comprising:
attaching another stackable integrated circuit package system to the stackable integrated circuit package system; and
attaching a second integrated circuit package on the another stackable integrated circuit package system.

11. A stackable integrated circuit package system comprising:
a first integrated circuit die having a small interconnect and a large interconnect provided thereon;
an external interconnect, having an upper tip and a lower tip each of substantially similar thickness and both including an exposed surface, electrically connected to the first integrated circuit die with the small interconnect on the lower tip and below the upper tip; and
a first mold compound surrounding the small interconnect and the large interconnect with an exposed surface, the first mold compound including a step-shaped recess along a boundary of the first mold compound adjacent a first mold compound sidewall, the first mold compound sidewall coplanar with a first integrated circuit die sidewall.

12. The system as claimed in claim 11 further comprising:
a second mold compound to surround the first integrated circuit die and the external interconnect.

13. The system as claimed in claim 11 further comprising:
a second mold compound to cover the first integrated circuit die and the external interconnect with both the upper tip and the lower tip including an exposed surface.

14. The system as claimed in claim 11 further comprising:
an additional integrated circuit die or integrated circuit package connected to the external interconnect, the large interconnect, the first integrated circuit die, or a combination thereof.

15. The system as claimed in claim 11 wherein the first integrated circuit die having large interconnects provided thereon with a distribution in a configuration of an array distribution, a peripheral distribution, a partially depopulated distribution, a multiple pitch distribution, or a combination thereof.

16. The system as claimed in claim 11 wherein:
the first integrated circuit die is a flip chip;
the external interconnect, having the upper tip and the lower tip, is a lead;
the first integrated circuit die on the external interconnect with the small interconnect on the lower tip and below the upper tip has an active side; and
the first mold compound to surround the small interconnect and the large interconnect with the exposed surface is an epoxy mold compound.

17. The system as claimed in claim 16 further comprising:
a second mold compound to surround the first integrated circuit die and the lead; and
a non-active side of the first integrated circuit die exposed.

18. The system as claimed in claim 16 further comprising:
a second integrated circuit die on the stackable integrated circuit package system; and
a mold compound to cover the second integrated circuit die.

19. The system as claimed in claim 16 further comprising a first integrated circuit package on the stackable integrated circuit package system.

20. The system as claimed in claim 16 further comprising:
another stackable integrated circuit package system on the stackable integrated circuit package system; and
a second integrated circuit package on the another stackable integrated circuit package system.

* * * * *